United States Patent
Yang et al.

(10) Patent No.: US 7,943,274 B2
(45) Date of Patent: May 17, 2011

(54) MASK PATTERN CORRECTION AND LAYOUT METHOD

(75) Inventors: Yu-Shiang Yang, Tainan County (TW); Hui-Fang Kuo, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 200 days.

(21) Appl. No.: 12/246,963

(22) Filed: Oct. 7, 2008

(65) Prior Publication Data

US 2010/0086862 A1    Apr. 8, 2010

(51) Int. Cl.
*G03F 1/00* (2006.01)
*G06F 17/50* (2006.01)
(52) U.S. Cl. .................. 430/5; 716/53; 716/55
(58) Field of Classification Search ............... 430/5, 30; 716/19, 53, 55; 382/144; 355/52, 67
See application file for complete search history.

(56) References Cited

U.S. PATENT DOCUMENTS

| | | | | |
|---|---|---|---|---|
| 6,622,297 | B2 * | 9/2003 | Uno et al. .................. | 716/52 |
| 2002/0151140 | A1 * | 10/2002 | Nakasugi .................. | 438/275 |
| 2005/0166112 | A1 * | 7/2005 | Okada et al. .................. | 714/735 |
| 2006/0057475 | A1 * | 3/2006 | Liebmann et al. ............. | 430/5 |
| 2006/0078805 | A1 * | 4/2006 | Hansen .................. | 430/5 |

\* cited by examiner

*Primary Examiner* — Stephen Rosasco
*Assistant Examiner* — Stewart A Fraser
(74) *Attorney, Agent, or Firm* — Winston Hsu; Scott Margo

(57) ABSTRACT

A mask pattern correction method is provided. The method comprises the following steps. An original layout, which has a plurality of device patterns, is provided. Then, a simulation process is performed on the device patterns to correspondingly form a plurality of simulated patterns. Thereafter, the simulated patterns are analyzed to select a plurality of unsaturated patterns from the simulated patterns. Finally, the device patterns in the original layout corresponding to the unsaturated patterns respectively are rotated.

18 Claims, 3 Drawing Sheets

MASK PATTERN CORRECTION AND LAYOUT METHOD

BACKGROUND OF THE INVENTION

1. Field of the Invention

The present invention relates to a layout method, and particularly relates to a mask pattern correction method.

2. Description of Related Art

As the integration of circuits continues to increase, the dimensions of circuit devices are developed to be miniaturized. Photolithography is an essential and critical step in the fabricating process of semiconductor devices. In metal-oxide-semiconductor (MOS) devices, for instance, structural elements, such as patterns of various layers and regions with dopants, are all defined by a photolithographic process.

Whether the device integration of semiconductor technology can advance to smaller critical dimensions (CD) is dependent upon the development of photolithographic technology. To meet such a requirement, methods for enhancing mask resolution, such as optical proximity correction (OPC) and phase shift mask (PSM), have been developed.

The objective of OPC is to eliminate the shift of critical dimension (CD) caused by proximity effect. The proximity effect refers to the enlargement of a light caused by diffraction when the light passes through a mask to form patterns on a chip. In addition, the light is reflected through a semiconductor substrate and a photoresist layer on the surface of the chip, which results in interference. Hence, the actual exposure dose of the photoresist layer is changed for repeated exposure. Such an effect becomes even more obvious when the critical dimensions are reduced, especially when the critical dimensions are close to the wavelength of the light.

Therefore, the conventional optical proximity correction is applied in improving the form of the opening patterns. However, during a correction process such as optical proximity correction, not all the openings can be corrected to a tolerable range of critical dimension bias value on each axis in one time of correction. When the bias value on the x axis is acceptable, the bias value on the y axis may not be tolerable. When the opening patterns are corrected to adjust the bias value on the y axis, the bias value on the x axis may exceed the tolerable range due to such a correction. Therefore, during the layout of the mask patterns, it usually requires a lot of time to repeatedly adjust each device pattern in the correction process.

SUMMARY OF THE INVENTION

The present invention is directed to a mask pattern correction method for increasing the accuracy and reliability of a correction process.

The present invention is also directed to a layout method for saving the time consumed in repeated correction processes during the formation of a mask pattern layout.

The present invention provides a mask pattern correction method, which comprises providing an original layout having a plurality of device patterns. Then, a simulation process is performed on the device patterns to correspondingly form a plurality of simulated patterns. Next, the simulated patterns are analyzed to select a plurality of unsaturated patterns from the simulated patterns. Finally, the device patterns in the original layout corresponding to the unsaturated patterns are rotated.

According to the mask pattern correction method in an embodiment of the present invention, the light source is an off-axis illumination (OAI). In addition, the off-axis illumination comprises a plurality of pupils, which is respectively disposed on a first axis and a second axis. The first axis and the second axis are perpendicular to each other. Moreover, the pupils are symmetrically arranged on the first axis and the second axis. Further, each of the rotated device patterns comprises a first set of opposite parallel edges and a second set of opposite parallel edges, and a first projection of the first axis projecting on a first plane on which the device patterns are located is perpendicular to the first set of opposite parallel edges of each of the rotated device patterns and a second projection of the second axis projecting on the first plane is perpendicular to the second set of opposite parallel edges of each of the rotated device patterns.

According to the mask pattern correction method in an embodiment of the present invention, the light source is a quadrupole illumination. Herein, the quadrupole illumination comprises a plurality of pupils. In addition, the quadrupole illumination comprises a plurality of pupils, and each pattern edge of each rotated device pattern is illuminated through a corresponding pupil.

According to the mask pattern correction method in an embodiment of the present invention, the device patterns comprise contact window patterns and via opening patterns.

According to the mask pattern correction method in an embodiment of the present invention, a form of the device patterns is quadrilateral.

According to the mask pattern correction method in an embodiment of the present invention, a form of the device patterns is square.

According to the mask pattern correction method in an embodiment of the present invention, a rotation angle of the rotated device patterns is 45 degrees.

The present invention further provides a layout method, which comprises providing an original layout having a plurality of opening patterns. Then, the opening patterns are rotated according to a rotation angle. Next, a correction process is performed on the original layout having the rotated opening patterns to correspondingly form a mask pattern layout comprising a plurality of mask patterns.

According to the layout method in an embodiment of the present invention, the light source is an off-axis illumination (OAI). The off-axis illumination comprises a plurality of pupils, which is respectively disposed on a first axis and a second axis. In addition, the first axis and the second axis are perpendicular to each other. The pupils are symmetrically arranged on the first axis and the second axis. Further, each of the rotated device patterns comprises a first set of opposite parallel edges and a second set of opposite parallel edges, and a first projection of the first axis projecting on a first plane on which the device patterns are located is perpendicular to the first set of opposite parallel edges of each of the rotated device patterns and a second projection of the second axis projecting on the first plane is perpendicular to the second set of opposite parallel edges of each of the rotated device patterns.

According to the layout method in an embodiment of the present invention, the light source is a quadrupole illumination. In addition, the quadrupole illumination comprises a plurality of pupils. Furthermore, the quadrupole illumination comprises a plurality of pupils, and each pattern edge of each rotated opening pattern is illuminated through a corresponding pupil.

According to the layout method in an embodiment of the present invention, the opening patterns comprise contact window patterns and via opening patterns.

According to the layout method in an embodiment of the present invention, a form of the opening patterns is quadrilateral.

According to the layout method in an embodiment of the present invention, a form of the opening patterns is square.

According to the layout method in an embodiment of the present invention, the rotation angle is 45 degrees.

To make the above and other objectives, features, and advantages of the present invention more comprehensible, preferable embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
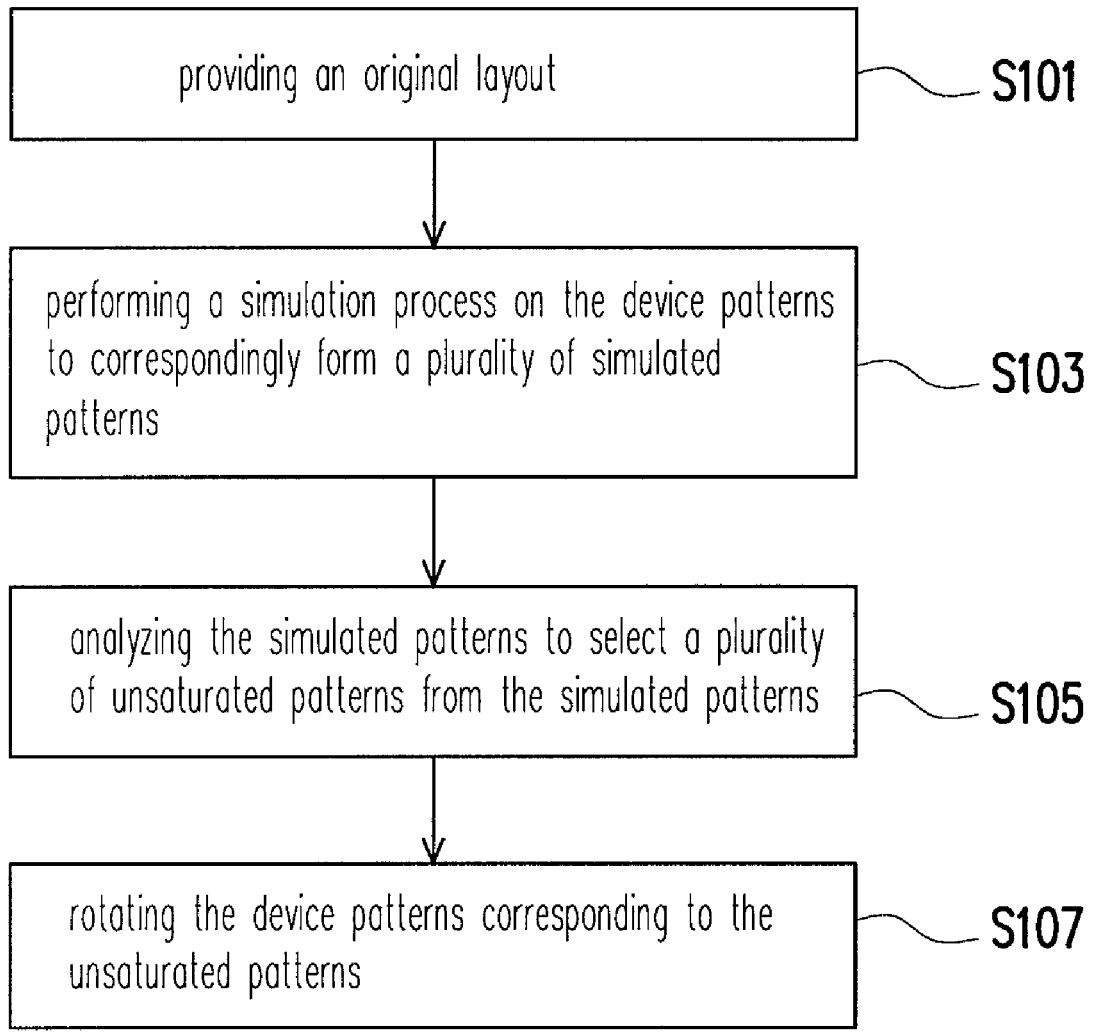
FIG. 1 is a process flow illustrating a mask pattern correction method according to an embodiment of the present invention.

FIG. 1 is a process flow illustrating a mask pattern correction method according to an embodiment of the present invention. Referring to FIG. 1, an original layout is first provided in a step S101, wherein the original layout comprises a plurality of device patterns. The device patterns comprise opening patterns, such as contact window patterns and via opening patterns. In addition, the device patterns are, for example, quadrilateral. Preferably, the device patterns are square.

Then, in a step S103, a simulation process is performed on the device patterns in the original layout to correspondingly form a plurality of simulated patterns. Before the aforesaid simulation process is performed, a correction process such as an optical proximity correction (OPC) process, is performed for correcting the original layout according to the proximity effect. After the correction process, a corrected mask pattern ready for being written onto a mask is generated. Thereafter, during the simulation process, a plurality of simulated patterns corresponding to the device patterns in the corrected mask pattern is obtained. The simulated patterns are the pattern copy result of performing a simulated lithography process with the corrected mask pattern. That is, the simulated patterns are the simulated ADI (i.e. after developed inspection) result of the corrected mask pattern after the correction process is performed.

Figure 2:
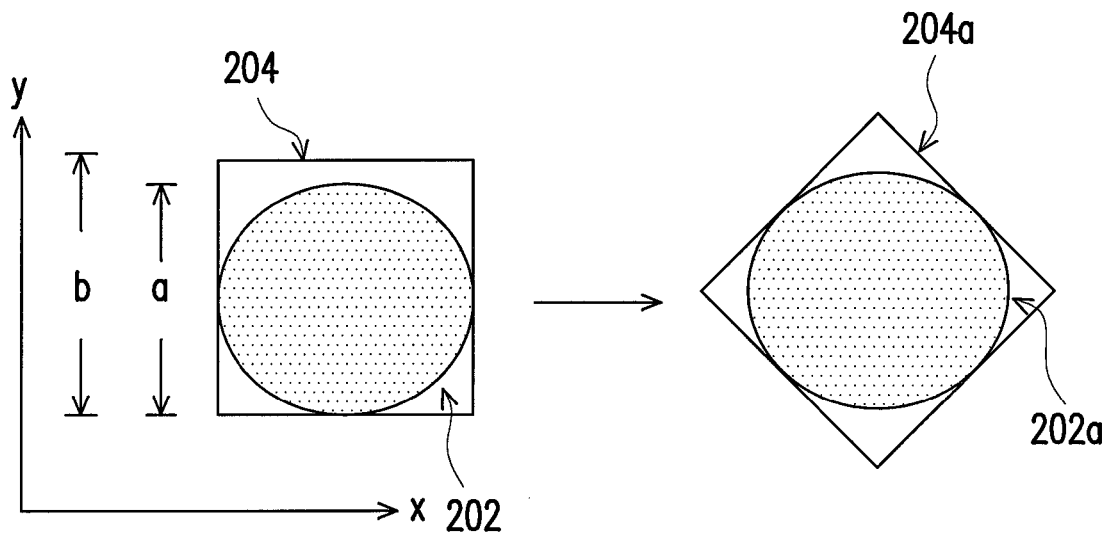
FIG. 2 is a schematic view illustrating a device pattern and a rotated device pattern corresponding to an unsaturated pattern according to an embodiment of the present invention.

Thereafter, the simulated patterns, which are generated from simulating the develop result of the corrected mask pattern, are analyzed in a step S105, so as to select a plurality of unsaturated patterns from the simulated patterns. FIG. 2 is a schematic view illustrating a device pattern and a rotated device pattern corresponding to an unsaturated pattern according to an embodiment of the present invention. Referring to FIG. 2, the aforesaid analysis process is, for example, to calculate a critical dimension error between a simulated pattern 202 and an ideal pattern 204. When the critical dimension error is larger than one nanometer, the simulated pattern is regarded as an unsaturated pattern. The so-called ideal pattern 204 is an ideal ADI result. In this embodiment, a discrepancy between the critical dimensions of the simulated pattern 202 and the ideal pattern 204 on an x axis is close to 0, which represents that the dimension of the simulated pattern 202 is close to that of the ideal pattern 204 on the x axis. However, a critical dimension a of the simulated pattern 202 on a y axis is 0.065 micrometer and a critical dimension b of the ideal pattern 204 on the y axis is 0.072 micrometer. The discrepancy is 7 nanometers, which is much larger than a tolerable range of 1 nanometer in a lithography process. Therefore, it is certain that the simulated pattern 202 in FIG. 2 is an unsaturated pattern.

Figure 3:
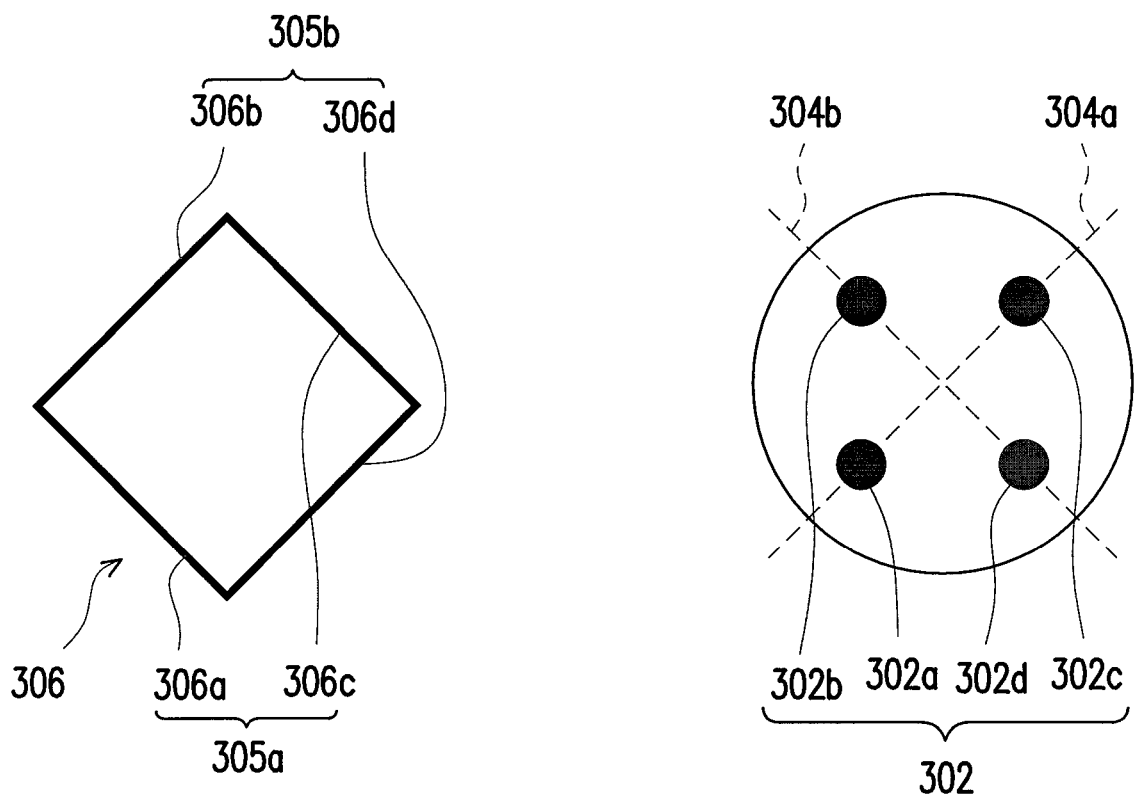
FIG. 3 is a schematic view illustrating an off-axis illumination according to an embodiment of the present invention.

Next, in a step S107, the device patterns in the original layout corresponding to the unsaturated patterns are rotated. The said light source is, for example, an off-axis illumination (OAI). Preferably, the light source can be, for example, a quadrupole illumination. Moreover, a rotation angle of the rotated device patterns is, for example, 45 degrees. FIG. 3 is a schematic view illustrating an off-axis illumination according to an embodiment of the present invention. Referring to FIG. 3, the light source in this embodiment is, for example, a quadrupole illumination comprising a plurality of pupils 302, which are pupils 302a, 302b, 302c, and 302d. The pupils 302a, 302b, 302c, and 302d are respectively disposed on a first axis 304a and a second axis 304b. Herein, the first axis 304a and the second axis 304b are perpendicular to each other. In addition, the pupils 302 are symmetrically arranged on the first axis 304a and the second axis 304b. Further, referring to FIG. 3, it is noted that, after the device pattern is rotated (i.e. a rotated device pattern 306 as shown in FIG. 3), each pattern edge (306a, 306b, 306c, and 306d) of the rotated device pattern 306 is respectively parallel to one of the projections of the first axis 304a and the second axis 304b projecting on the plane, on which the device patterns are located.

On the other words, in one embodiment, the projection of the second axis 304b, where the pupils 302b and 302d are located, projecting on the plane where the device patterns are located is parallel to a first set 305a of the opposite parallel edges (including the pattern edge 306a and the pattern edge 306c which are opposite to each other) of the rotated device pattern 306 and is perpendicular to a second set 305b of the opposite parallel edges (including the pattern edge 306b and the pattern edge 306d which are opposite to each other) of the rotated device pattern 306. Furthermore, the projection of the first axis 304a, where the pupils 302a and 302c are located, projecting on the plane where the device patterns are located is parallel to the second set 305b of the opposite parallel edges (including the pattern edge 306b and the pattern edge 306d which are opposite to each other) of the rotated device pattern 306 and is perpendicular to the first set 305a of the opposite parallel edges (including the pattern edge 306a and the pattern edge 306c which are opposite to each other) of the rotated device pattern 306. That is, each pattern edge of each rotated device pattern is respectively illuminated through a corresponding pupil. Consequently, one pattern edge (one of 306a, 306b, 306c, and 306d) is illuminated by the light source through only one pupil. When a correction process is performed, complex interference, which influences the correction result, is prevented because each pattern edge of each rotated device pattern is not affected by the light source from a plurality of pupils.

Referring to FIG. 2, after the device pattern is rotated for about a rotation angle, the illumination on each pattern edge is simplified and the resolution of pattern transfer is improved. As a consequence, the discrepancy between the critical dimensions of a simulated pattern 202a and an ideal pattern 204a on each axis is within a tolerable range.

In the aforesaid embodiment, the simulated patterns are obtained after the correction process is performed on the device patterns in the original layout. Then, the unsaturated patterns are selected therefrom, and the device patterns corresponding to the unsaturated patterns are rotated. However, the present invention is not limited to the aforesaid process.

Figure 4:
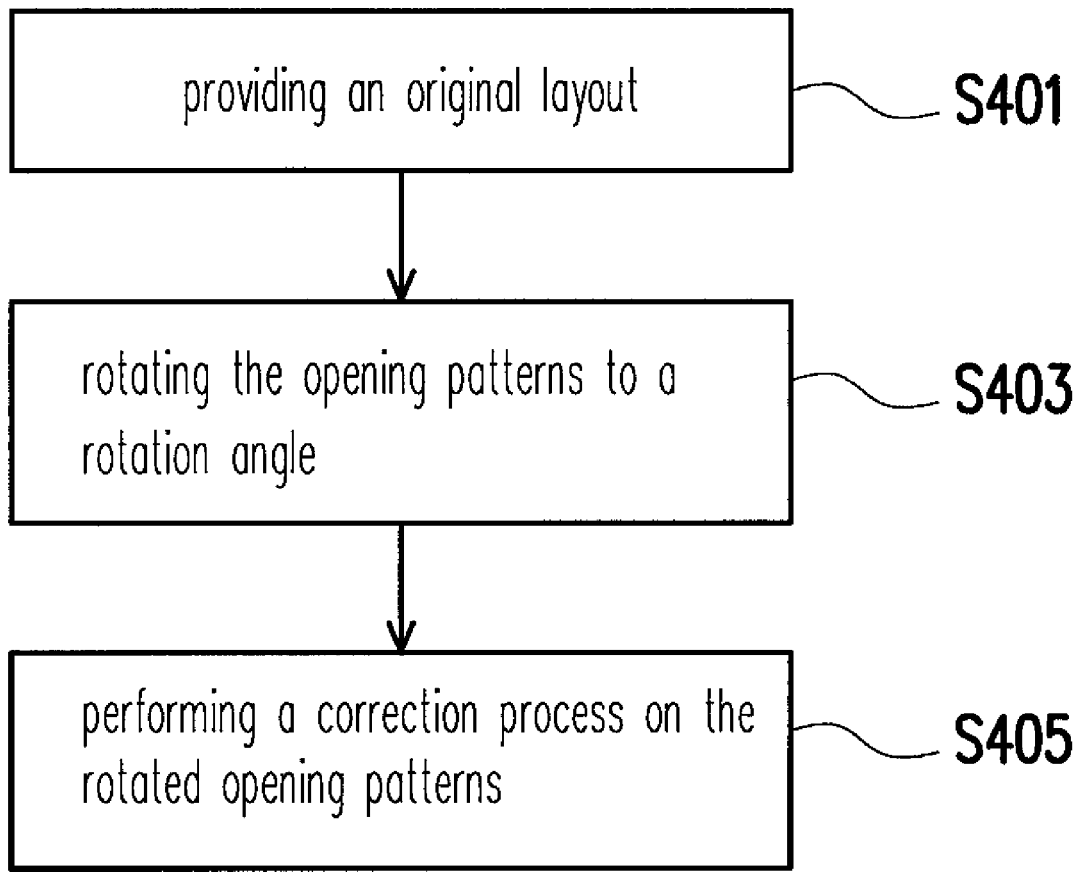
FIG. 4 is a process flow illustrating a layout method according to an embodiment of the present invention.

The following embodiment describes an establishment of a layout, in which a correct process on an original layout is performed after all the related opening patterns in the original layout are rotated. FIG. 4 is a process flow illustrating a layout method according to an embodiment of the present invention. Referring to FIG. 4, an original layout is first provided in a step S401, wherein the original layout comprises a plurality of opening patterns. The aforesaid opening patterns are, for example, contact window patterns and via opening patterns. Then, in a step S403, the opening patterns are rotated for about a rotation angle so that the projections of the first axis and the second axis, where the pupils a light source used in a succeeding lithography process are located, projecting on the plane where the opening patterns are located are either parallel to or perpendicular to one of the pattern edges of each opening pattern. Finally, in a step S405, a correction process is performed on the original layout having the rotated opening patterns to correspondingly form a mask pattern layout comprising a plurality of corrected mask patterns. The aforesaid mask patterns constitute the mask pattern layout, which is the original layout directly applied on the mask for fabricating devices after undergoing the correction process. In addition, the variety of the light source, the form of the opening patterns, and the corresponding positions of the rotated opening patterns and the light axis of the light source have been described in the preceding embodiment. Thus, the descriptions thereof are not repeated hereafter.

To conclude, in the present invention, the device patterns showing the unsaturated patterns after the correction process are rotated to reduce the error of critical dimensions of the patterns undergoing the correction process. Thereby, the reliability and accuracy of the correction process is increased. Moreover, the rotation of the device patterns helps to adjust the device patterns undergoing the correction process, so as to greatly reduce a cycle time required in the whole processes of forming the mask pattern layout.

Although the present invention has been disclosed by the above embodiments, they are not intended to limit the present invention. Persons skilled in the art may make some modifications and alterations without departing from the spirit and scope of the present invention. Therefore, the protection range of the present invention falls in the appended claims.

What is claimed is:

1. A mask pattern correction method, comprising:
   an off-axis illumination light source wherein the off-axis illumination light source comprises a plurality of pupils respectively disposed on a first and second axis;
   providing an original layout, wherein the original layout comprises a plurality of device patterns; performing a correction process on the device patterns to correspondingly form a plurality of simulated patterns; analyzing the simulated patterns to select a plurality of unsaturated patterns from the simulated patterns; and exclusively rotating the device patterns in the original layout only one time corresponding to the unsaturated patterns without rotating the device patterns in the original layout again;
   wherein each of the rotated device patterns comprises a first set of opposite parallel edges and a second set of opposite parallel edges, and a first projection of the first axis projecting on a first plane on which the device patterns are located is perpendicular to the first set of opposite parallel edges of each of the rotated device patterns and a second projection of the second axis projection on the first plane is perpendicular to the second set of opposite parallel edges of each of the rotated device patterns.

2. The correction method as claimed in claim 1, wherein the first axis and the second axis are perpendicular to each other.

3. The correction method as claimed in claim 1, wherein the pupils are symmetrically arranged on the first axis and the second axis.

4. The correction method as claimed in claim 1, wherein a light source is a quadrupole illumination.

5. The correction method as claimed in claim 4, wherein the quadrupole illumination comprises a plurality of pupils, and each pattern edge of each rotated device pattern is illuminated through a corresponding pupil.

6. The correction method as claimed in claim 1, wherein the device patterns comprise contact window patterns and via opening patterns.

7. The correction method as claimed in claim 1, wherein a form of the device patterns is quadrilateral.

8. The correction method as claimed in claim 1, wherein a form of the device patterns is square.

9. The correction method as claimed in claim 1, wherein a rotation angle of the rotated device patterns is 45 degrees.

10. A layout method, comprising:
    an off-axis illumination light source wherein the off-axis illumination light source comprises a plurality of pupils respectively disposed on a first and second axis;
    providing an original layout, wherein the original layout comprises a plurality of opening patterns; exclusively rotating the opening patterns only one time according to a rotation angle without rotating the opening patterns again; and performing a correction process on the original layout comprising the rotated opening patterns to correspondingly form a mask pattern layout comprising a plurality of mask patterns;
    wherein each of the rotated opening patterns comprises a first set of opposite parallel edges and a second set of opposite parallel edges, and a first projection of the first axis projecting on a first plane on which the opening patterns are located is perpendicular to the first set of opposite parallel edges of each of the rotated opening patterns and a second projection of the second axis projection on the first plane is perpendicular to the second set of opposite parallel edges of each of the rotated opening patterns.

11. The layout method as claimed in claim 10, wherein the first axis and the second axis are perpendicular to each other.

12. The layout method as claimed in claim 10, wherein the pupils are symmetrically arranged on the first axis and the second axis.

13. The layout method as claimed in claim 10, wherein the light source is a quadrupole illumination.

14. The layout method as claimed in claim 13, wherein the quadrupole illumination comprises a plurality of pupils, and each pattern edge of each rotated opening pattern is illuminated through a corresponding pupil.

15. The layout method as claimed in claim 10, wherein the opening patterns comprise contact window patterns and via opening patterns.

16. The layout method as claimed in claim 10, wherein a form of the opening patterns is quadrilateral.

17. The layout method as claimed in claim 10, wherein a form of the opening patterns is square.

18. The layout method as claimed in claim 10, wherein the rotation angle is 45 degrees.

* * * * *